(12) United States Patent
Dittrich et al.

(10) Patent No.: US 7,532,506 B2
(45) Date of Patent: May 12, 2009

(54) INTEGRATED CIRCUIT, CELL ARRANGEMENT, METHOD OF OPERATING AN INTEGRATED CIRCUIT, MEMORY MODULE

(75) Inventors: Rok Dittrich, Paris (FR); Ulrich Klostermann, Munich (DE)

(73) Assignees: Qimonda AG, Munich (DE); Altis Semiconductor, SNC, Corbeil Essonnes Cedex (FR)

( * ) Notice: Subject to any disclaimer, the term of this patent is extended or adjusted under 35 U.S.C. 154(b) by 46 days.

(21) Appl. No.: 11/856,656

(22) Filed: Sep. 17, 2007

(65) Prior Publication Data

US 2009/0073749 A1    Mar. 19, 2009

(51) Int. Cl.
*G11C 11/00*    (2006.01)
(52) U.S. Cl. ............ 365/158; 365/148; 365/171
(58) Field of Classification Search ........... 365/158, 365/148, 171
See application file for complete search history.

(56) References Cited

U.S. PATENT DOCUMENTS

| | | | |
|---|---|---|---|
| 6,674,662 B1 | 1/2004 | Hillebrands et al. | |
| 7,061,797 B1 | 6/2006 | Miltat et al. | |
| 7,082,052 B2* | 7/2006 | Rinerson et al. | 365/171 |
| 2005/0237796 A1 | 10/2005 | Kim et al. | |
| 2007/0001251 A1* | 1/2007 | Saito | 365/158 |

FOREIGN PATENT DOCUMENTS

| | | |
|---|---|---|
| DE | 198 23 826 A1 | 12/1999 |
| DE | 10 2005 062 769 A1 | 7/2006 |

OTHER PUBLICATIONS

Suess, D., et al., "Fast switching of small magnetic particles," Journal of Magnetisim and Magnetic Materials, Apr. 2002, pp. 426-429, vol. 242-245, Elsevier Science B.V., Amsterdam, The Netherlands.
Kaka, S., et al., "Precessional switching of submicrometer spin valves," Applied Physics Letters, Apr. 22, 2002, pp. 2958-2960, vol. 80, No. 16, American Institute of Physics, Melville, NY.
Suess, D., "Dissertation: Micromagnetic Simulations Of Antiferro—and Ferromagnetic Structures For Magnetic Recording," Jun. 3, 2002, pp. 1-192, Vienna University of Technology, Vienna, Austria.
Schumacher, H.W., et al., "Phase Coherent Precessional Magnetization Reversal in Microscopic Spin Valve Elements," Physical Review Letters, Jan. 10, 2003, 4 pages, vol. 90, No. 1, American Physical Society, Ridge, NY.

(Continued)

*Primary Examiner*—Huan Hoang

(57) ABSTRACT

An integrated circuit having a cell arrangement is provided. The cell arrangement includes at least one magnetoresistive memory cell, a first line providing a first line current, and a second line providing a second line current. The cell arrangement further includes a controller controlling the application of the first line current and the second line current, such that while the first line current is active, a transition of a magnetic field provided by a change of the second line current is provided such that the transition time of the magnetic field is shorter than the time required for the magnetization of the magnetoresistive memory cell to relax into a changed equilibrium state.

25 Claims, 9 Drawing Sheets

OTHER PUBLICATIONS

Schumacher, H.W., et al., "Quasiballistic Magnetization Reversal," Physical Review Letters, Jan. 10, 2003, 4 pages, vol. 90, No. 1, American Physical Society, Ridge, NY.

Devolder, T., et al., "Switching speed in high density MRAM based on precessional or spin-transfer switching," International Conference on Memory Technology and Design 2005, May 21-24, 2005, pp. 117-119, France.

Devolder, T., et al., "Switching speed in high density MRAM based on precessional or spin-transfer switching," Presentation Materials, International Conference on Memory Technology and Design 2005, May 21-24, 2005, 27 pages, France.

Sun, J.Z., "Spin angular momentum transfer in current-perpendicular namomagnetic junctions," IBM Journal of Research & Development, Jan. 2006, pp. 81-100, vol. 50, No. 1, IBM, Yorktown Heights, NY.

Inokuchi, T., et al. "Current-induced magnetization switching under magnetic field applied along the hard axis in MgO-based magnetic tunnel junctions," (abstract), Applied Physics Letters, Sep. 4, 2006, 3 pages, vol. 89, No. 10, American Institute of Physics, Melville, NY.

* cited by examiner

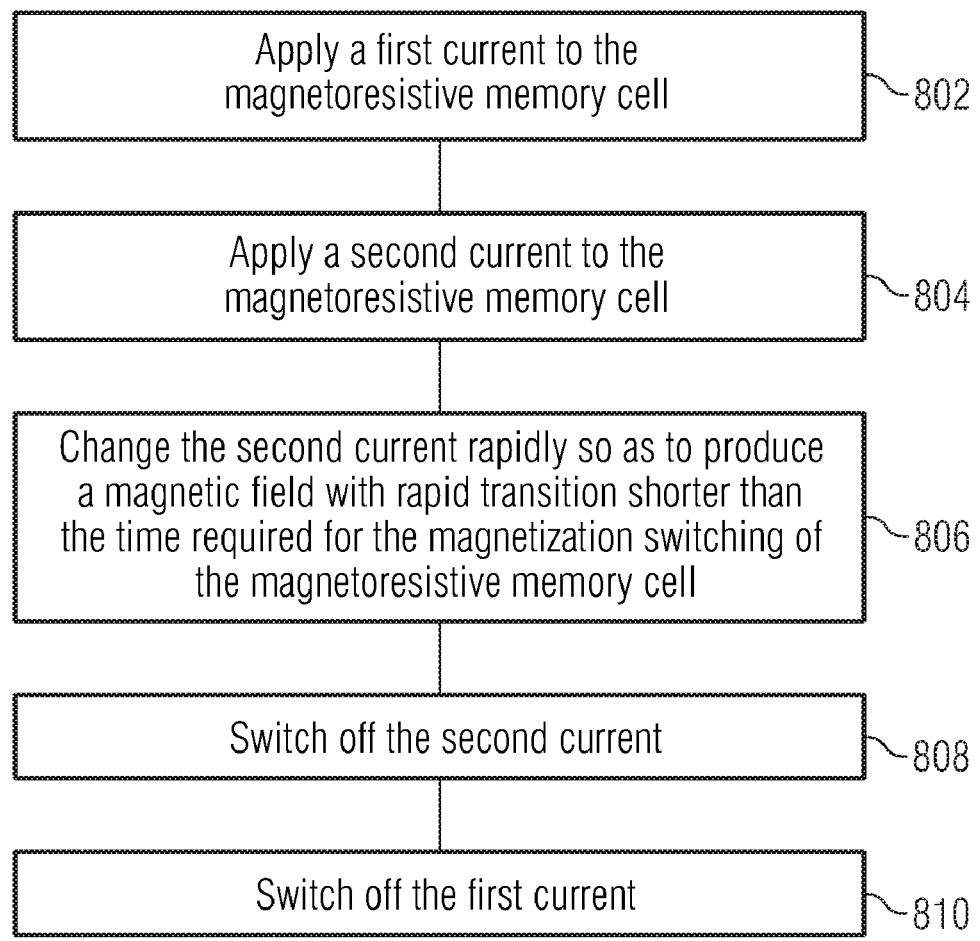

INTEGRATED CIRCUIT, CELL ARRANGEMENT, METHOD OF OPERATING AN INTEGRATED CIRCUIT, MEMORY MODULE

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIG. 8 shows a flowchart of operating an integrated circuit according to another embodiment of the invention;

DETAILED DESCRIPTION OF ILLUSTRATIVE EMBODIMENTS

Figure 1:
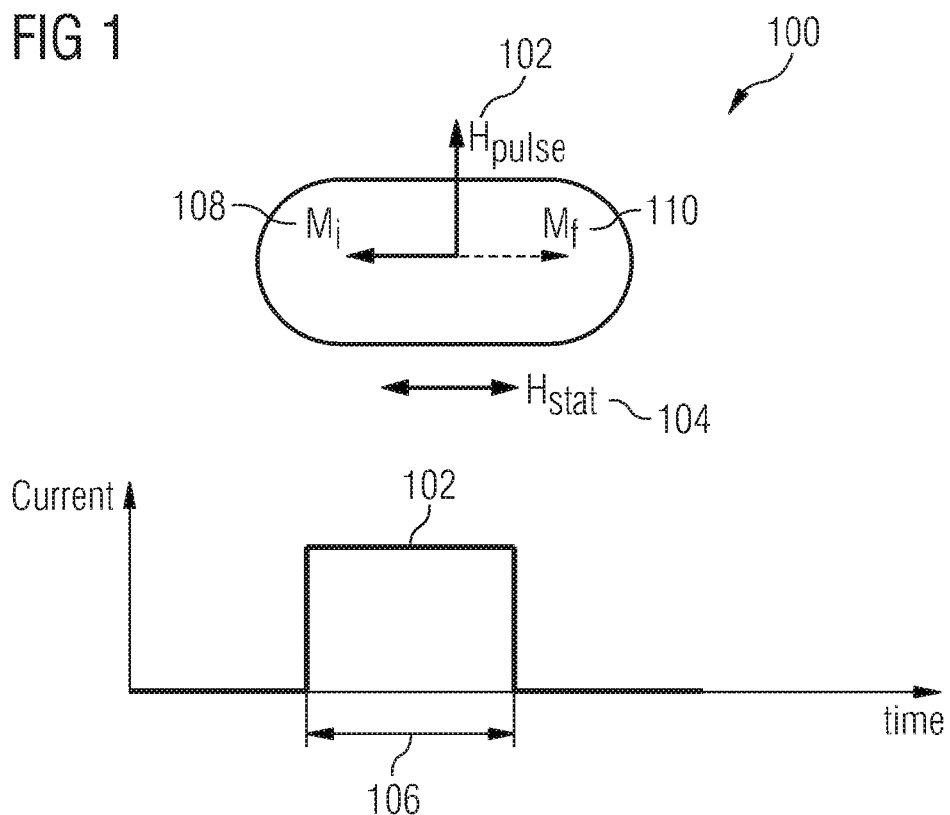
FIG. 1 shows the magnetic fields applied to a magnetoresistive memory cell.

Magnetic random access memories (MRAM) are a new class of non-volatile memories, which exploits the electromagnetic properties of magnetoresistive materials to set and maintain information stored within individual magnetic memory cells. The individual magnetic memory cell is also called magnetic tunnel junctions (MTJ). Specifically, digital information is stored within a magnetic memory cell as a bit, the state of which is indicated by the direction of magnetization within one magnetic layer of the memory cell relative to another magnetic layer of the memory cell. A typical magnetic memory cell may comprise two magnetic layers sandwiching a tunnel barrier layer. One magnetic layer has a fixed magnetic orientation, which may be referred to as the pinned magnetic layer or the reference layer. The reference layer serves as a reference for another magnetic layer within the cell. The other magnetic layer, also referred to as free magnetic layer or storage layer, can be adapted to change its magnetic orientation relative to the reference layer such that logic states of a bit may be stored within the magnetic tunnel junction.

Typically, an MRAM device includes a plurality of conductive lines which are used to generate magnetic fields. An array of memory cells may be constructed by placing the conductive lines in a matrix structure having rows and columns, with the magnetic memory cells being placed at the intersection of the conductive lines. The conductive lines are referred to as bit lines (BL) and word lines (WL). Conventionally, the current flowing through the bit lines and the word lines creates an induced magnetic field, which is used to switch the magnetization of the magnetic memory cell. This mode of switching is known as Stoner-Wohlfarth switching. This also holds true for Toggle MRAM devices.

A relative new mode of switching called Spin-Torque transfer or Spin Transfer switching is advantageous for high density MRAM devices. Generally, Spin Transfer switching occurs when a current flowing through a magnetic layer of the MTJ gets spin polarized, and imparts a spin torque on the storage layer of the MTJ. If a sufficient spin torque is applied to the storage layer, the torque pumps enough energy to the storage layer for its magnetic moment to precess, thereby switching the magnetization of the storage layer.

The high write current required to produce the magnetic field makes Stoner-Wohlfarth switching difficult to be applicable for high density MRAM devices. Spin Transfer switching, although reduces the amount of current required to write the MTJ by utilizing spin torques, still requires a high critical write current. The high write current would limit the scaling of MTJs, since the size of the transistor providing the current is required to be larger. On the other hand, the high write current would result in reduced write margin, since the switching voltage is close to the barrier breakdown voltage. As a result, the reliability and endurance of the MTJs would be reduced. Therefore, there is a need to reduce the write current required for the switching of MTJs.

An external magnetic field pulse achieves a switching of the magnetoresistive memory cell. Furthermore, applying a fast rising field pulse perpendicular to the magnetization of the storage layer of the MTJ, i.e., along the in-plane magnetic hard axis direction, results in an energy efficient switching of the MTJ. For example, in FIG. 1, a field pulse $H_{pulse}$ 102 perpendicular to the magnetization of the MTJ and a static field $H_{stat}$ 104 parallel to the magnetization of the MTJ are illustrated in a diagram 100. By controlling the pulse duration 106 a desirable switching of the magnetization is achieved from an initial magnetization $M_i$ 108 to a final magnetization $M_f$ 110.

An embodiment of the invention achieves a reduction of write current for switching the magnetization of magnetoresistive memory cells by providing an ultra fast transition of a magnetic field. With its transition time shorter than the typical magnetic relaxation time (<~gyromagnetic frequency), the change of the magnetic field results in an almost instant change of the energy landscape of the memory cell. The magnetization is in a region of increased energy, as the new local minimum configurations have changed. Thus, the memory cell is provided with additional energy, resulting in a lower switching field than for the conventional quasi-static switching. Therefore, the magnetization of the memory cell can be switched using smaller write currents compared with the situation wherein the magnetic field is applied statically.

An embodiment of the invention relates to an integrated circuit having a cell arrangement. The cell arrangement includes at least one magnetoresistive memory cell, a first line providing a first line current, and a second line providing a second line current. The cell arrangement further includes a controller controlling the application of the first line current and the second line current, such that while the first line current is active, a transition of a magnetic field provided by a change of the second line current is provided such that the transition time of the magnetic field is shorter than the time required for the magnetization of the magnetoresistive memory cell to relax into a changed equilibrium state. In an embodiment of the invention, the time required for the magnetization of the magnetoresistive memory cell to relax into a changed equilibrium state may be in the order of some periods of the dominating eigenmode frequencies of the magnetoresistive memory cell. In an embodiment of the invention, the time required for the magnetization of the magnetoresistive memory cell to relax into a changed equilibrium state may be a time range corresponding to a frequency range in the order of one or more GHz.

In one embodiment, the magnetoresistive memory cell is a magnetic tunnel junction (MTJ) cell including a storage magnetic layer, a tunnel barrier layer and a reference magnetic layer. The storage magnetic layer and the reference magnetic layer may be made from magnetic materials, examples of which includes, but are not limited to, nickel, iron, cobalt or combinations thereof such as e.g. nickel iron, nickel iron cobalt, cobalt iron, cobalt zirconium niobium, cobalt iron boron, iron platinum, cobalt platinum, and alloys of these materials. Other magnetic materials used in the MRAM fabrication industry may also be used for the storage magnetic layer and the reference magnetic layer. It is noted that the storage magnetic layer and the reference magnetic layer each may include multiple layers of materials. The tunnel barrier layer may be made from dielectric materials, such as Silicon Oxide ($SiO_2$), Magnesium Oxide (MgO), Silicon Nitride ($SiN_2$), Aluminum Oxide ($Al_2O_3$), Aluminum Nitride (AlNx) and Tantalum Oxide (TaOx), or can be made from non-magnetic materials, such as Copper, Gold and Silver.

In another embodiment, the first line and the second line are arranged perpendicular to each other, with the magnetoresistive memory cell located at the intersection of the first line and the second line.

The first line may be a bit line, and accordingly the first line current may be the bit line current provided by the bit line. In an embodiment, the bit line current is provided in the range of about 2 mA to about 80 mA. In another embodiment, the bit line current may be in the range of about 3 mA to about 60 mA. In a further embodiment, the bit line current is in the range of about 10 mA to about 50 mA. The bit line current is used to produce a magnetic field for the magnetoresistive memory cell, for example.

According to another embodiment of the invention, the first line is a tunnel junction line, and the first line current is the tunnel junction line current. For example, the tunnel junction line current is the current flowing through the magnetic tunnel junction in the situation of Spin Transfer switching. The tunnel junction line current may be provided in the range of about 1 µA to about 10 mA, e.g. in the range of about 20 µA to about 5 mA. In a further embodiment, the tunnel junction line current is provided in the range of about 50 µA to about 1 mA. The tunnel junction line current may also be in the range of about 100 µA to about 500 µA.

The controller included in the cell arrangement may have a microcontroller, a plurality of controllers, or may comprise a plurality of logic gates operating together to control the application of the first line current and the second line current. In particular, the controller is configured to provide a transition of a magnetic field by controlling the change of the second line current when the first line current is active.

The transition time of the magnetic field provided by the change of the second line current is shorter than about 10 ns according to one embodiment of the invention. In another embodiment, the transition time of the magnetic field is shorter than about 1 ns. In a further embodiment, the transition time of the magnetic field is in the range of about 10 ps to about 200 ps. The transition time of the magnetic field is shorter than the time required for changing the magnetization of the magnetoresistive memory cell, such that the switching field of the magnetoresistive memory cell is reduced. Thus, a smaller first line current and a smaller second line current are required to change the magnetization of the magnetoresistive memory cell compared with the conventional quasi-static switching mode.

According to an embodiment of the invention, the second line is a word line and the second line current is a word line current. The word line is in one example connected with the magnetoresistive memory cell. In another example, the word line is coupled to the magnetoresistive memory cell without direct contact. The word line current may be provided in the range of about 2 mA to about 80 mA. In other embodiments, the word line current may be provided in a different range. For example, the word line current may be in the range of about 3 mA to about 60 mA. In another example, the word line current may be in the range of about 10 mA to about 50 mA.

The at least one magnetoresistive memory cell in the cell arrangement may be selected from a plurality of types of magnetoresistive memory cells. In one embodiment, the magnetoresistive memory cell is selected to be a Stoner-Wohlfarth type magnetoresistive memory cell. The magnetization orientation of the magnetoresistive memory cell may be switched using two orthogonal magnetic fields generated at the magnetoresistive memory cell, for example.

In another embodiment of the invention, the at least one magnetoresistive memory cell is selected to be a Spin-Torque type magnetoresistive memory cell. Accordingly, the magnetization orientation of the magnetoresistive memory cell may be switched using a spin-polarized current flowing through the magnetoresistive memory cell.

Another embodiment of the present invention relates to a cell arrangement. The cell arrangement includes at least one magnetoresistive memory cell, a first line providing a first line current, and a second line providing a second line current. The cell arrangement further includes a controller controlling the application of the first line current and the second line current, such that while the first line current is active, a transition of a magnetic field provided by a change of the second line current is provided such that the transition time of the magnetic field is shorter than the time required for the magnetization of the magnetoresistive memory cell to relax into a changed equilibrium state.

A further embodiment of the present invention relates to an integrated circuit having a cell arrangement. The cell arrangement includes at least one magnetoresistive memory cell, a first line providing a first line current, a second line providing a second line current, and a controller controlling the application of the first line current and the second line current. The controller controls the application of the first line current and the second line current such that while the first line current is active, a transition of a magnetic field provided by a change of the second line current is provided. The magnetic field is provided such that it has a non-zero angle with regard to the magnetization orientation of the magnetoresistive memory cell. And the transition of the magnetic field is sufficiently fast to reduce the switching field of the magnetoresistive memory cell.

In an embodiment, the magnetic field provided by the second line current has a right angle (90°) with regard to the magnetization orientation of the magnetoresistive memory cell. In other embodiments, the magnetic field may be provided to have other angle with regard to the magnetization orientation of the magnetoresistive memory cell, e.g. 45°, 60°, etc.

The first line may be a bit line, and the first line current may be the bit line current. In one embodiment, the bit line current is provided in the range of about 2 mA to about 80 mA. The first line may also be a tunnel junction line. Accordingly, the first line current is the tunnel junction line current flowing through the magnetic tunnel junction. The tunnel junction line current is provided in the range of about 20 µA to about 5 mA according to an embodiment of the invention.

The transition of the magnetic field is provided to be sufficiently fast. In one embodiment, the time of the transition of the magnetic field may be shorter than about 10 ns. The controller may control the transition of the magnetic field to be even faster. For example, the time of the transition of the magnetic field may be shorter than about 1 ns in another embodiment. With a fast transition of the magnetic field, the switching field of the magnetoresistive memory cell is reduced such that the magnetization can be switched using a smaller first line current and a smaller second line current.

The second line included in the cell arrangement may be a word line, and the second line current may be the word line current. The word line current is provided in a suitable range. For example, the word line current may be provided in the range of about 2 mA to about 80 mA.

In one embodiment of the invention, the at least one magnetoresistive memory cell included in the cell arrangement is a Stoner-Wohlfarth type magnetoresistive memory cell. In another embodiment of the invention, the at least one magnetoresistive memory cell is a Spin-Torque type magnetoresistive memory cell.

Another embodiment of the present invention relates to a method of operating an integrated circuit having a cell arrangement. The method includes applying a first current to at least one magnetoresistive memory cell. The method further includes applying, at least partially at the same time, a transition of a magnetic field provided by a change of a second current such that the transition time of the magnetic field is shorter than the time required for the magnetization of the magnetoresistive memory cell to relax into a changed equilibrium state. The method may be used to operate an integrated circuit having different embodiments of the cell arrangement as illustrated above.

The first current may be a bit line current provided by a bit line. The bit line current with a suitable value is provided. In one embodiment, the bit line current is provided in the range of about 2 mA to about 80 mA. In other embodiments, the bit line current is in the range of about 3 mA to about 60 mA, and may also be in the range of about 10 mA to about 50 mA.

The first current may be a tunnel junction current provided by a tunnel junction line in another embodiment of the invention. The tunnel junction current may be provided in any suitable range of values. In one embodiment, the tunnel junction current is in the range of about 20 µA to about 5 mA. In another example, the tunnel junction current is in the range of about 50 µA to about 1 mA. In a further example, the tunnel junction current is in the range of about 100 µA to about 500 µA.

According to an embodiment of the invention, the transition time of the magnetic field is applied to be shorter than the time required for the magnetization of the magnetoresistive memory cell to relax into a changed equilibrium state. In one embodiment, the transition time of the magnetic field is applied to be shorter than about 10 ns. In another embodiment, the transition time of the magnetic field is shorter than about 1 ns. The transition time of the magnetic field may be provided to be shorter, in the range of about 10 ps to about 200 ps, for example.

The second current may be a word line current provided by a word line. In one embodiment, the word line current is in the range of about 2 mA to about 80 mA. In another embodiment, the word line current is in the range of about 3 mA to about 60 mA. In a further embodiment, the word line current is in the range of about 10 mA to about 50 mA.

The at least one magnetoresistive memory cell may be a Stoner-Wohlfarth type magnetoresistive memory cell. The magnetoresistive memory cell may be a Spin-Torque type magnetoresistive memory cell in another embodiment. Other types of magnetoresistive memory cells may be used as the magnetoresistive memory cell as well.

Another embodiment of the present invention leads to a memory module including a plurality of integrated circuits, wherein at least one integrated circuit of the plurality of integrated circuits includes a cell arrangement. The cell arrangement includes at least one magnetoresistive memory cell, a first line providing a first line current, a second line providing a second line current, and a controller. The controller controls the application of the first line current and the second line current such that while the first line current is active, a transition of the magnetic field provided by a change of the second line current is provided such that the transition time of the magnetic field is shorter than the time required for the magnetization of the magnetoresistive memory cell to relax into a changed equilibrium state.

In one embodiment, the memory module is a stackable memory module in which at least some of the integrated circuits are stacked one above the other.

Figure 2:
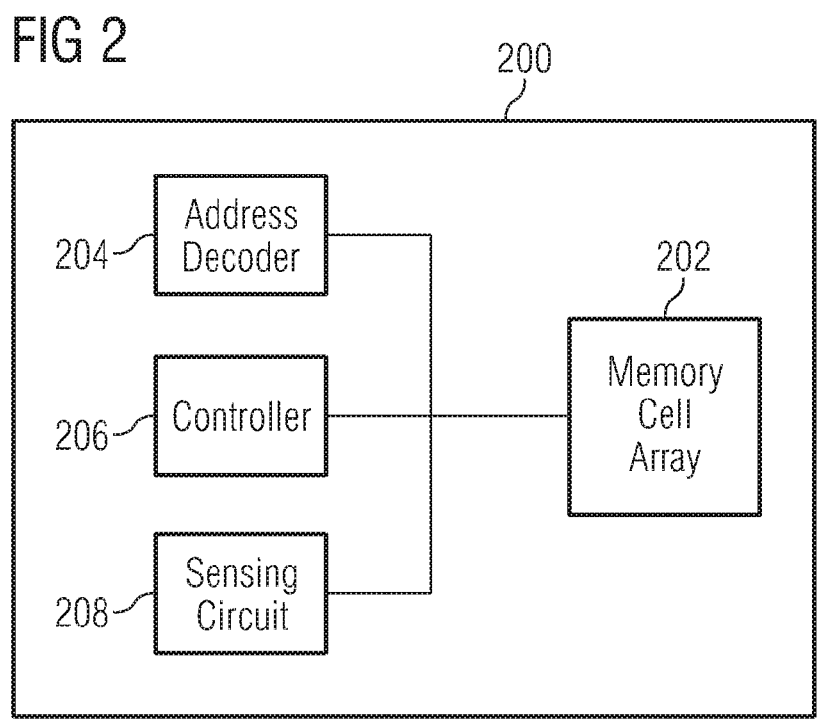
FIG. 2 shows an integrated circuit in accordance with an embodiment of the invention.

FIG. 2 illustrates an integrated circuit 200 in accordance with an exemplary embodiment of the invention.

The integrated circuit 200 includes, inter alia, a memory cell array 202 which includes a plurality of memory cells, wherein the memory cells may be arranged in rows and columns in a matrix form, and one or a plurality of reference cells which are designed and manufactured in the same way as the memory cells and which provide a reference state in order to determine the memory state of the respectively selected memory cell of the memory cell array. It should be mentioned that the memory cells in the memory cell array 202 may be arranged in a different way than in a matrix form, for example in zig-zag architecture. Furthermore, in an alternative embodiment of the invention, a sensing scheme may be provided using a self-referencing.

Furthermore, the integrated circuit 200 includes an address decoder 204, which receives a logical address of a memory cell to be selected, for example a memory cell to be programmed, read or erased, and maps the logical address of the memory cell to the actual physical address of the memory cell to be selected within the memory cell array 202. Furthermore, the address decoder 202 provides the select signal to the control lines, to which the memory cell to be selected is connected to such that the desired memory cell within the memory cell array 202 is selected.

Furthermore, a controller 206, for example a microprocessor, in an alternative embodiment of the invention implemented as hard wired logic, is provided. The controller 206 provides voltage signals in order to provide the required voltages and currents in order to perform the respectively selected operation on the selected memory cell within the memory cell array 202. By way of example, the controller 206 provides a sequence of voltages and currents to a selected memory cell in order for example to program the magnetization direction of the selected memory cells.

Furthermore, a sensing circuit 208 is provided, the sensing circuit 208 being, in one embodiment of the invention, formed by one or a plurality of sense amplifiers (for example one or more current amplifier(s) or one or more voltage amplifier(s)) which are used to sense the current flowing through a selected memory cell within the memory cell array 202 and compare it with the current flowing to a selected reference cell, thereby providing a difference current, which may be used for determining the programming state of the memory cell which is selected. Furthermore, in an alternative embodiment of the invention, a sensing scheme may be provided using a self-referencing.

Figure 3A:
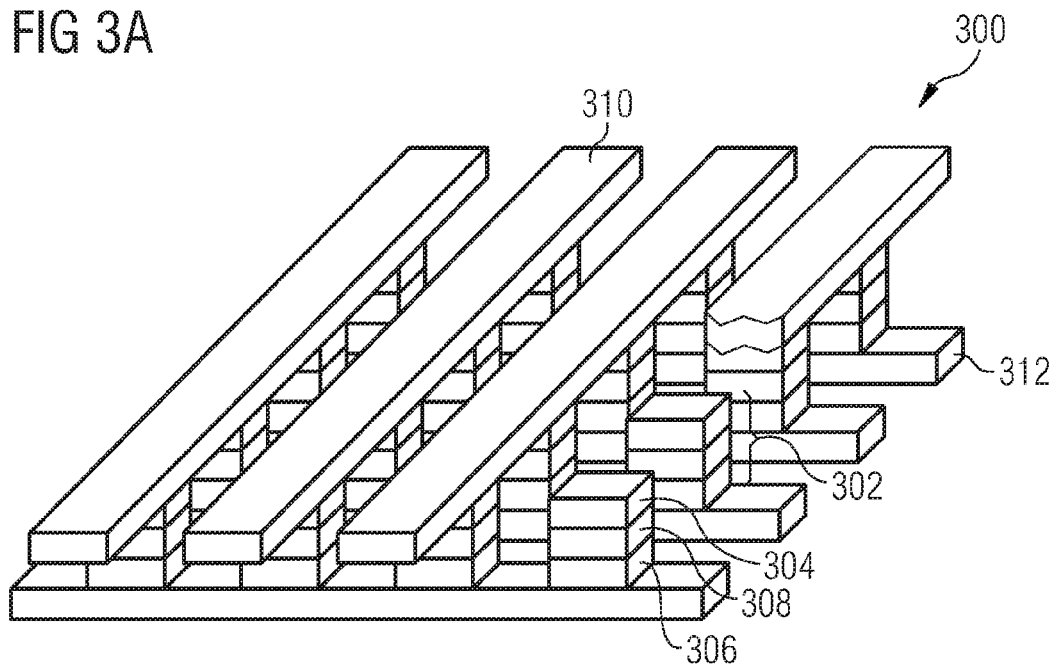
FIG. 3A shows a memory cell array according to one embodiment of the invention.

The memory cell array according to one embodiment of the invention is illustrated in FIG. 3A. The memory cell array 300 includes a plurality of magnetoresistive memory cells 302 arranged in matrix configuration. In an embodiment of the invention, the magnetoresistive memory cell 302 includes a storage layer 304, a reference layer 306 and a tunnel barrier layer 308 sandwiched in between. It is to be noted that the storage layer 304 and the reference layer 306 may each comprise multiple, layers where appropriate. Two groups of conductive lines are arranged in rows and columns such that the magnetoresistive memory cells 302 lie at the intersection of the two groups of conductive lines. In one example, the first group of conductive lines are bit lines 310 arranged next to the storage layer 304 of the magnetoresistive memory cells 302, and the second group of conductive lines are word lines 312 arranged next to the reference layer 306 of the magnetoresistive memory cells 302. The bit lines 310 are arranged perpendicular to the word lines 312. It is noted that the order of the bit lines 310 and the word lines 312 may be reversed, such that the bit lines 310 are arranged next to the reference layer 306 and the word lines 312 are arranged next to the storage layer 304 of the magnetoresistive memory cells 302. In an alternative embodiment of the invention, a common plate structure may be provided in which a common electrically conductive plate is used to generate a contact to the tunnel junction (or sensing path), thereby galvanically separating the sensing scheme from the field programming.

In the context of Stoner-Wohlfarth switching, the current flowing through the bit lines 310 and the current flowing through the word lines 312 each produces a magnetic field, which results in an induced magnetic field to switch the magnetization of the magnetoresistive memory cells 302 at the intersection of the bit lines 310 and the word lines 312. In an example according to an embodiment of the invention, the current flowing through the word lines 312 is provided such that the magnetic field produced thereof changes rapidly. This would allow the magnetization of the memory cells 302 to be switched by a lower intensity magnetic field, thereby reducing the intensity of the current through the bit lines 310 and the word lines 312.

Figure 3B:
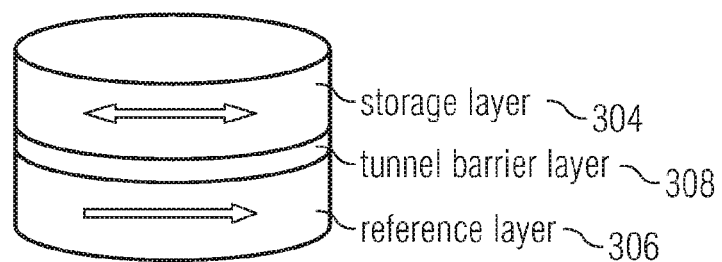
FIG. 3B shows a magnetoresistive memory cell according to an embodiment of the invention.

The magnetoresistive memory cells 302 may have different configurations, such as in rectangular, circular or elliptical shape, depending on the design choices. FIG. 3B is an example of an elliptical magnetoresistive memory cell.

Figure 4:
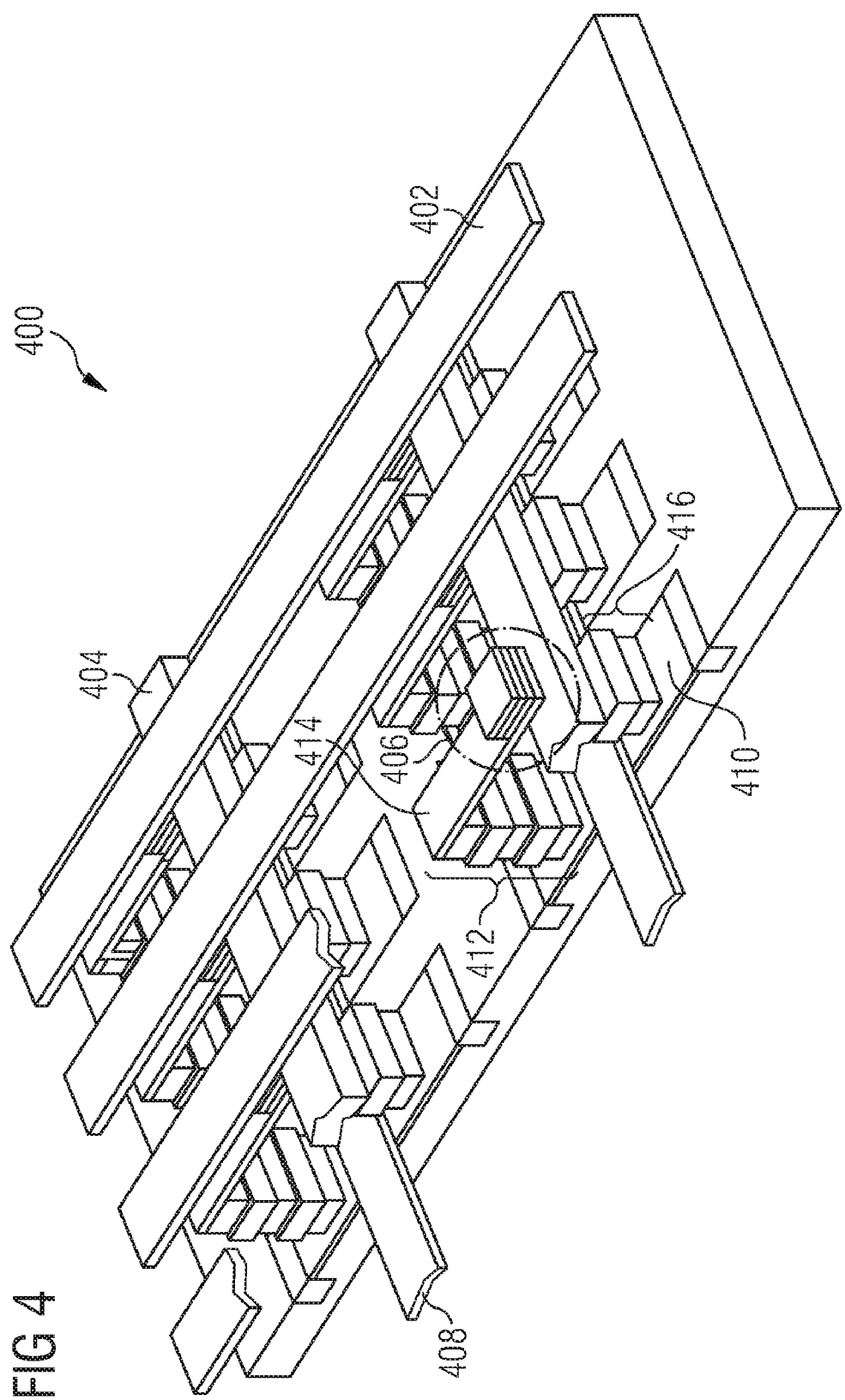
FIG. 4 shows a memory cell array according to another embodiment of the invention.

The configuration of the memory cell array may be, in another example, a 1T1MTJ (one transistor, one MTJ) architecture 400, as shown in FIG. 4. In this architecture, each MTJ stack (i.e., the magnetoresistive memory cell) is connected with a transistor, as will be explained below. The bit lines 402 and the word lines 404 are arranged in a matrix structure having rows and columns, with the MTJ stacks 406 being arranged at the intersection of the respective pair of lines. A third group of conductive lines, i.e., the control lines 408 are arranged such that they are parallel to the word lines 404 and perpendicular to the bit lines 402. The control lines 408 are connected to the gate of the respective transistor 410, while the drain of the respective transistor 410 is connected to the MTJ stack 406 through a conductive structure 412 and an interconnect layer 414. The ground contact 416 of the transistor 410 is also shown. Thus, the control lines 408 control for example the selection of the respective MTJ stack 406 through the respective transistor 410.

Figure 5:
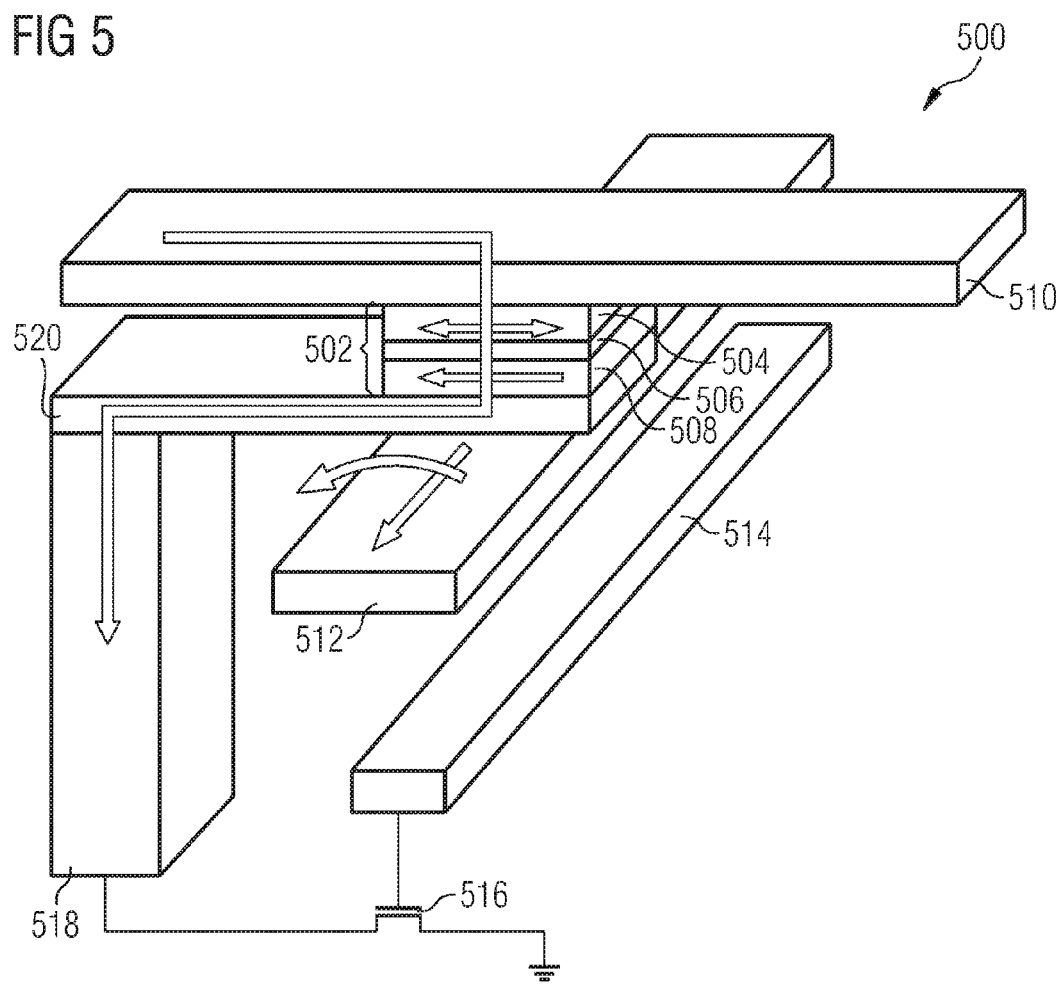
FIG. 5 shows a magnetoresistive memory cell according to an embodiment of the invention.

The 1T1MTJ structure is illustrated in further detail with reference to FIG. 5, wherein only one transistor and one MTJ stack is shown in a 1T1MTJ structure portion 500. The magnetic tunnel junction (MTJ) stack 502 includes a storage layer 504, a tunnel barrier layer 506 and a reference layer 508. The storage layer 504 has a switchable magnetic orientation, while the reference layer 508 has a fixed magnetic orientation.

A bit line 510 is coupled to the MTJ stack 502 next to its storage layer 504. A word line 512 and a control line 514, arranged parallel to each other while perpendicular to the bit line 510, are coupled to the MTJ stack 502 next to the reference layer 508 side of the MTJ 502 without direct contact. The word line 512 and the control line 514 may be parallel to each other in a vertical direction as an example shown in FIG. 5, or may be parallel to each other in a horizontal direction depending on the design of the cell structure. The control line 514 is connected to the gate of a transistor 516 to activate the MTJ 502 for read and write operations. The drain of the transistor 516 is connected to the reference layer 508 of the MTJ via a conductive structure 518 and an interconnect layer 520. The conductive structure 518 may be a single conductive layer, or may include various vias, interconnects and additional conductive structures. The source of the transistor 516 may be grounded. It is to be noted that various types of transistors may be used depending on the design of the circuit, wherein the connected component of the source, drain and gate of the transistors will be changed correspondingly.

For example in the context of spin transfer switching of the magnetoresistive memory cell, the control line 514 switches on the transistor 516, and the current is provided by the bit line 510. The current flowing through the MTJ stack 502 switches the magnetization of the MTJ stack 502 if the intensity of the current is sufficiently high. Furthermore, current with a particular direction flowing through the word line 512 generates a magnetic field, which works in addition to the spin polarized current to switch the magnetization orientation of the storage layer 504. In an example according to an embodiment of the invention, the current is provided by the word line 512 such that the magnetic field produced thereof is changed rapidly, which enables the magnetization switching of the MTJ stack 502 at a smaller spin polarizing current.

Figure 6:
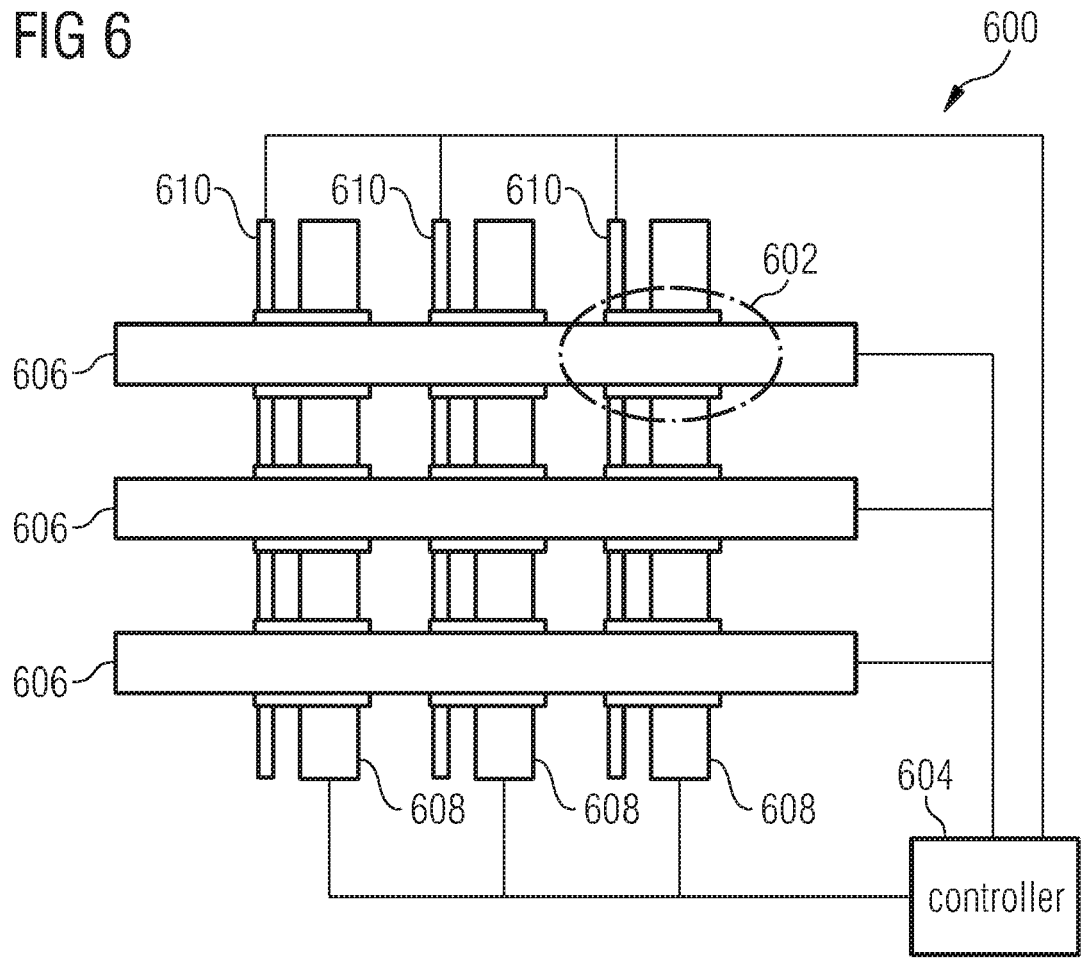
FIG. 6 shows a top view of a cell arrangement according to one embodiment of the invention.

FIG. 6 shows a top view of a cell arrangement 600 according to one embodiment of the invention. The cell arrangement 600 includes a plurality of cells 602 and a controller 604 for programming the plurality of cells 602. As shown in FIG. 6, the controller 604 is connected with every bit line 606, word line 608 and control line 610, such that the current through each of these lines is controlled by the controller 604. For example, if the controller 604 determines to program a Stoner-Wohlfarth type memory cell 602, it will generate a control signal controlling the current through the bit line 606 corresponding to the cell 602, and controlling the current through the corresponding word line 608 to produce a rapid changing magnetic field. If in another example the controller 604 determines to program a Spin-Torque type memory cell, it will generate a control signal controlling the current flowing through the memory cell 602, and controlling the current through the corresponding word line 608 to produce a rapid changing magnetic field. The controller 604 may be a microcontroller. It may also include a plurality of sub-controllers, for example, a bit line sub-controller, a word line sub-controller and a control line sub-controller such that each sub-controller controls the different groups of conductive lines, respectively.

It is to be understood that the cell arrangement 600 can also only include bit lines 606 and word lines 608 without control lines 610, similar to the structure of FIG. 3A. In such a case, the controller 604 is connected with every bit line 606 and word line 608 so as to control the current through each of these lines. Similarly, the controller 604 may include sub-controllers, such as a bit line sub-controller and a word line sub-controller each controlling the bit lines and the word lines, respectively.

Figure 7:
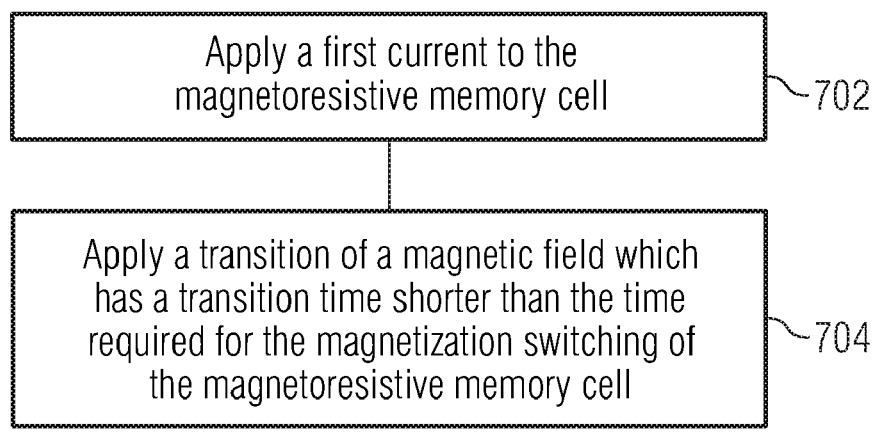
FIG. 7 shows a flowchart of operating an integrated circuit according to one embodiment of the invention.

FIG. 7 shows a flowchart of operating an integrated circuit having a cell arrangement according to one embodiment of the invention. At 702, a first current is applied to the magnetoresistive memory cell. At least partially at the same time, for example, shortly after the application of the first current, a transition of a magnetic field is applied at 704. The transition time of the magnetic field is shorter than the time required for the magnetization of the magnetoresistive memory cell to relax into a changed equilibrium state. By way of example, the magnetic field is produced using a second current, and the transition of the magnetic field is provided by a change of the second current.

FIG. 8 shows a flowchart of operating an integrated circuit having a cell arrangement according to another embodiment of the invention. A first current is applied to the magnetoresistive memory cell at 802. Then, a second current is applied to the magnetoresistive memory cell at 804. The second current is changed rapidly at 806 so as to produce a magnetic field with rapid transition shorter than the time required for the magnetization switching of the magnetoresistive memory cell. Such a rapid transition of the magnetic field enables the switching of the magnetization of the magnetoresistive memory cell under the application of the first current and the second current with a lower intensity. The second current is then switched off at 808. Finally, the first current is switched off at 810, so that the switched magnetization of the magnetoresistive memory cell is maintained. It should be mentioned that in an alternative embodiment of the invention, the process 806 may be a part of the process 804 or of the process 808.

Figure 9A:
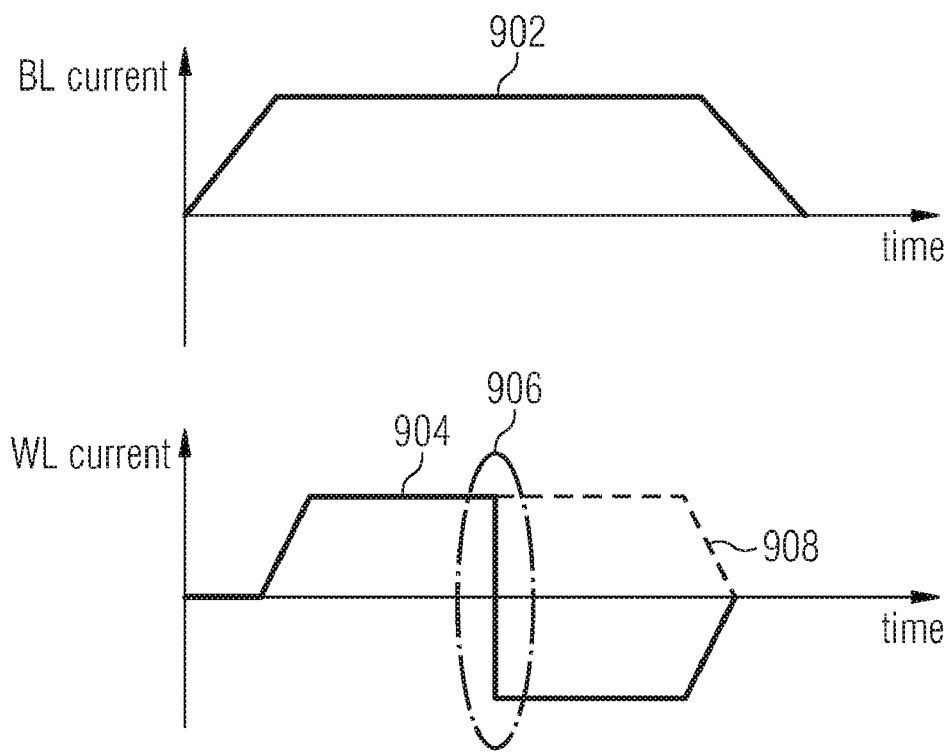
FIGS. 9A and 9B show the application of the write current in one embodiment and another embodiment of the invention, respectively.

FIG. 9A shows the application of the current controlled by the controller in one embodiment of the invention. For example, the magnetoresistive memory cell is a Stoner-Wohlfarth type magnetoresistive memory cell. In order to change the magnetization of the memory cell, an induced magnetic field produced by current flowing through both the bit line and the word line is required.

As shown in FIG. 9A, the BL current 902 through the bit line is provided. Then the WL current 904 is provided through the word line, for example, a few ns later than the application of the BL current 902. A rapid change 906 of the WL current 904 is then provided. The change is for example an ultra fast change of the direction and/or the amplitude of the WL current 904. Compared to the WL current 908 which is applied quasi-statically, in an embodiment of the invention, a lower switching field can be achieved than for the conventional quasi-static switching. As a result, the magnetization of the magnetoresistive memory cell can be switched using the BL current 902 and the WL current 904 in lower intensity. It is to be noted that the time point of the transition is not important. As long as there is a sufficiently fast transition when the BL current 902 is active, the switching field of the magnetoresistive memory cell may be reduced.

Figure 9B:
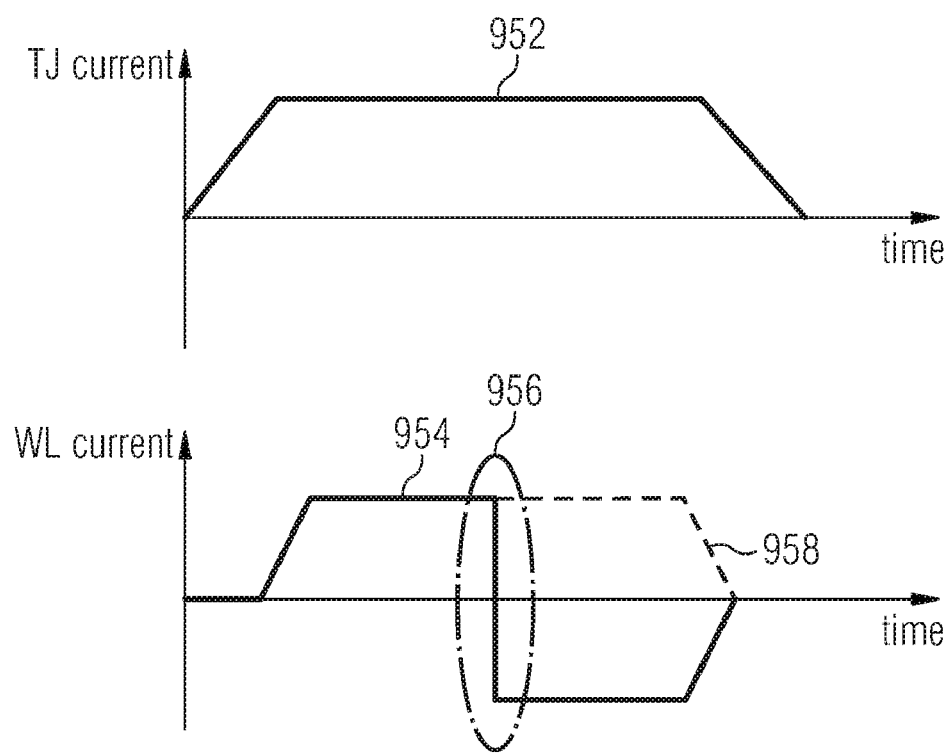

FIG. 9B shows the application of the current controlled by the controller in another embodiment of the invention. In this embodiment, the magnetoresistive memory cell is a Spin-Torque type magnetoresistive memory cell, which utilizes a current flowing through the magnetoresistive memory cell to change the magnetization of the memory cell. As shown in FIG. 9B, the current 952 called TJ current is provided to flow through the tunnel junction of the memory cell. The WL current 954 is then provided through the word line to provide an additional magnetic field in order to facilitate the magnetization switching of the memory cell. A rapid change 956 of the WL current 954, for example in direction and/or in amplitude, is then provided. Compared to the WL current 958 which is applied statically, in an embodiment of the invention, a lower switching field can be achieved than for the conventional quasi-static switching. Accordingly, the magnetization of the magnetoresistive memory cell can be switched using the BL current 952 and the WL current 954 in lower intensity.

Figure 10:
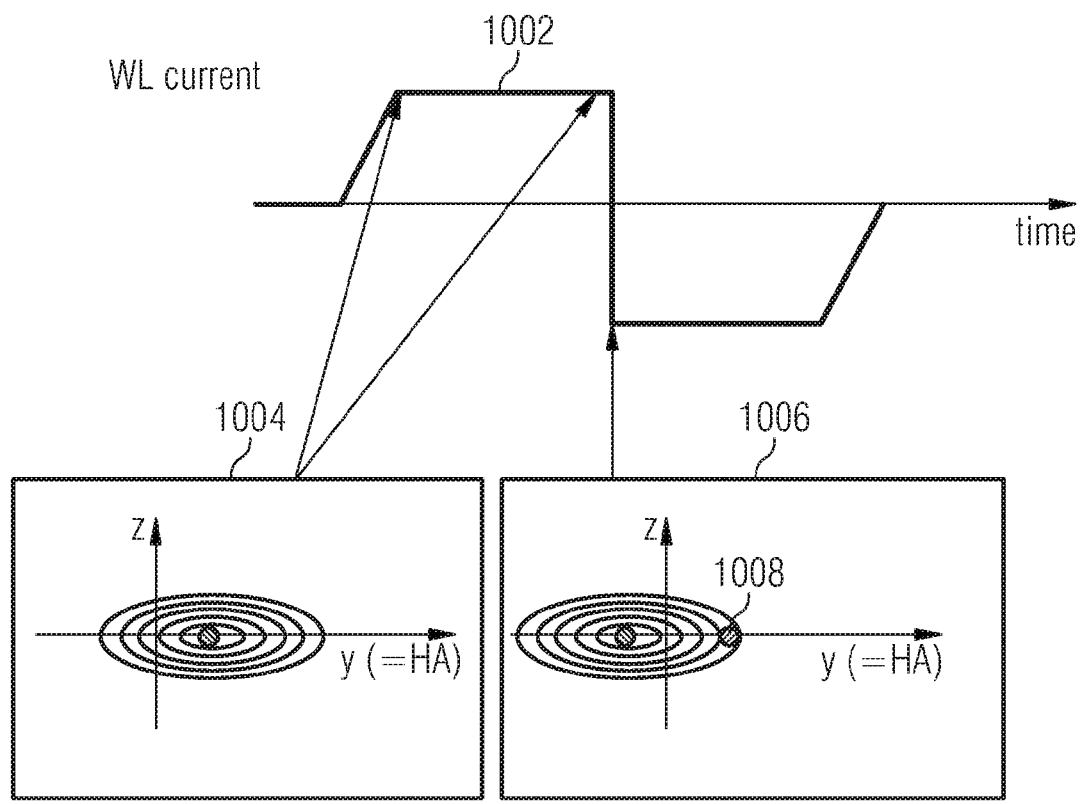
FIG. 10 shows the rapid change of current and magnetization according to an embodiment of the invention.

The rapid change of the WL current is explained in more detail in FIG. 10. As shown, the WL current 1002 with a rapid change is provided. The magnetization of the memory cell 1004 and 1006 corresponding to the static WL current and to the rapid changing WL current respectively is shown. Since the transition is fast, the magnetization can not adiabatically follow the minimum energy as the energy landscape changes shape too rapidly, which is for example in the range of 10-200 ps. Thus, the magnetization is in a non-equilibrium state with higher energy as depicted by the dot 1008. The additional energy allows switching of the magnetization at current and field lower than that required in the static current situation.

Figure 11A:
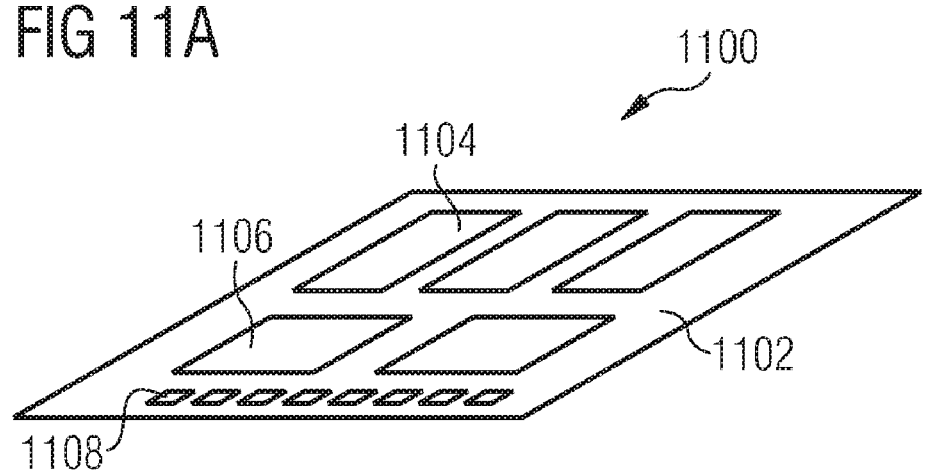
FIGS. 11A and 11B show a memory module (FIG. 11A) and a stackable memory module (FIG. 11B) in accordance with an embodiment of the invention.
Figure 11B:
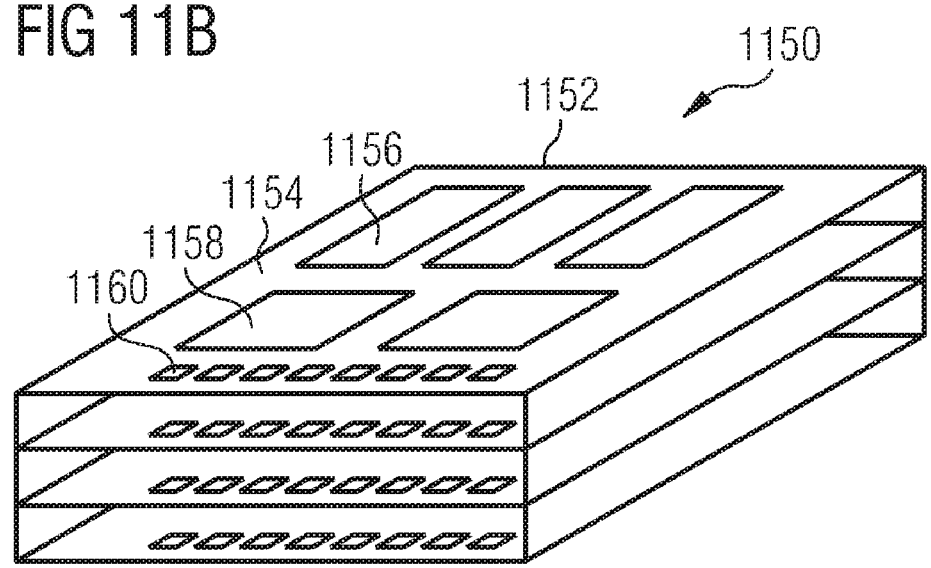

As shown in FIGS. 11A and 11B, in some embodiments, memory devices such as those described herein may be used in modules. In FIG. 11A, a memory module 1100 is shown, on which one or more memory devices 1104 are arranged on a substrate 1102. The memory device 1104 may include numerous memory cells, each of which uses a memory element in accordance with an embodiment of the invention. The memory module 1100 may also include one or more electronic devices 1106, which may include memory, processing circuitry, control circuitry, addressing circuitry, bus interconnection circuitry, or other circuitry or electronic devices that may be combined on a module with a memory device, such as the memory device 1104. Additionally, the memory module 1100 includes multiple electrical connections 1108, which may be used to connect the memory module 1100 to other electronic components, including other modules.

As shown in FIG. 11B, in some embodiments, these modules may be stackable, to form a stack 1150. For example, a stackable memory module 1152 may contain one or more memory devices 1156, arranged on a stackable substrate 1154. The memory device 1156 contains memory cells that employ memory elements in accordance with an embodiment of the invention. The stackable memory module 1152 may also include one or more electronic devices 1158, which may include memory, processing circuitry, control circuitry, addressing circuitry, bus interconnection circuitry, or other circuitry or electronic devices that may be combined on a module with a memory device, such as the memory device 1156. Electrical connections 1160 are used to connect the stackable memory module 1152 with other modules in the stack 1150, or with other electronic devices. Other modules in the stack 1150 may include additional stackable memory modules, similar to the stackable memory module 1152 described above, or other types of stackable modules, such as stackable processing modules, control modules, communication modules, or other modules containing electronic components.

In an embodiment of the invention, an integrated circuit having a cell arrangement is provided. The cell arrangement may include at least one magnetoresistive memory cell, a first line providing a first line current, a second line providing a second line current, and a controller controlling the application of the first line current and the second line current such that while the first line current is active, a transition of a magnetic field provided by a change of the second line current is provided such that the transition time of the magnetic field is shorter than the time required for the magnetization of the magnetoresistive memory cell to relax into a changed equilibrium state.

The first line may be a bit line and the first line current may be the bit line current.

The bit line current may be in the range of about 2 mA to about 80 mA.

The bit line current may be in the range of about 3 mA to about 60 mA.

The bit line current may be in the range of about 10 mA to about 50 mA.

In an embodiment of the invention, the first line is a tunnel junction line and the first line current is the tunnel junction line current, wherein the tunnel junction line current may be in the range of about 20 µA to about 5 mA.

Furthermore, in an embodiment of the invention, the tunnel junction line current is in the range of about 50 µA to about 1 mA.

The tunnel junction line current may be in the range of about 100 µA to about 500 µA.

The transition time of the magnetic field may be shorter than about 10 ns, e.g. shorter than about 1 ns. By way of example, the transition time of the magnetic field may be in the range of about 10 ps to about 200 ps.

The second line may be a word line and the second line current may be the word line current.

In an embodiment of the invention, the word line current is in the range of about 2 mA to about 80 mA, e.g. in the range of about 3 mA to about 60 mA, e.g. in the range of about 10 mA to about 50 mA.

In an embodiment of the invention, the at least one magnetoresistive memory cell is a Stoner-Wohlfarth type magnetoresistive memory cell.

In another embodiment of the invention, the at least one magnetoresistive memory cell is a Spin-Torque type magnetoresistive memory cell.

In yet another embodiment of the invention, a cell arrangement is provided. The cell arrangement may include at least one magnetoresistive memory cell, a first line providing a first line current, a second line providing a second line current, and a controller controlling the application of the first line current and the second line current such that while the first line current is active, a transition of a magnetic field provided by a change of the second line current is provided such that the transition time of the magnetic field is shorter than the time required for the magnetization of the magnetoresistive memory cell to relax into a changed equilibrium state.

In yet another embodiment of the invention, an integrated circuit having a cell arrangement. The cell arrangement may include at least one magnetoresistive memory cell, a first line providing a first line current, a second line providing a second line current, and a controller controlling the application of the first line current and the second line current such that while the first line current is active, a transition of a magnetic field provided by a change of the second line current is provided, wherein the magnetic field has a non-zero angle with regard to the magnetization orientation of the magnetoresistive memory cell, and wherein the transition of the magnetic field is sufficiently fast to reduce the switching field of the magnetoresistive memory cell.

The first line may be a bit line and the first line current may be the bit line current.

The bit line current may be in the range of about 2 mA to about 80 mA.

In an embodiment of the invention, the first line is a tunnel junction line and the first line current is the tunnel junction line current.

In this case, the tunnel junction line current may be in the range of about 20 µA to about 5 mA.

The time of the transition of the magnetic field may be shorter than about 10 ns.

The time of the transition of the magnetic field may be shorter than about 1 ns.

In an embodiment of the invention, the second line is a word line and the second line current is the word line current.

The word line current may be in the range of about 2 mA to about 80 mA.

Furthermore, the at least one magnetoresistive memory cell may be a Stoner-Wohlfarth type magnetoresistive memory cell.

In another embodiment of the invention, the at least one magnetoresistive memory cell may be a Spin-Torque type magnetoresistive memory cell.

In yet another embodiment of the invention, a method of operating an integrated circuit having a cell arrangement is provided. The method may include applying a first current to at least one magnetoresistive memory cell, and applying, at least partially at the same time, a transition of a magnetic field provided by a change of a second current such that the transition time of the magnetic field is shorter than the time required for the magnetization of the magnetoresistive memory cell to relax into a changed equilibrium state.

The first current may be a bit line current.

Furthermore, the bit line current may be in the range of about 2 mA to about 80 mA, e.g. in the range of about 3 mA to about 60 mA, e.g. in the range of about 10 mA to about 50 mA.

In an embodiment of the invention, the first current is the tunnel junction current, wherein the tunnel junction current may be in the range of about 20 µA to about 5 mA, e.g. in the range of about 50 µA to about 1 mA, e.g. in the range of about 100 µA to about 500 µA.

In an embodiment of the invention, the transition time of the magnetic field is shorter than about 10 ns.

The transition time of the magnetic field may be shorter than about 1 ns.

The transition time of the magnetic field may be in the range of about 10 ps to about 200 ps.

In an embodiment of the invention, the second current is a word line current, wherein the word line current may be in the range of about 2 mA to about 80 mA.

The word line current may be in the range of about 3 mA to about 60 mA.

The word line current may be in the range of about 10 mA to about 50 mA.

In an embodiment of the invention, a Stoner-Wohlfarth type magnetoresistive memory cell may be used as the at least one magnetoresistive memory cell.

In another embodiment of the invention, a Spin-Torque type magnetoresistive memory cell may be used as the at least one magnetoresistive memory cell.

In yet another embodiment of the invention, a memory module is provided, which may include a plurality of integrated circuits, wherein at least one integrated circuit of the plurality of integrated circuits includes a cell arrangement. The cell arrangement may include at least one magnetoresistive memory cell, a first line providing a first line current, a second line providing a second line current, and a controller controlling the application of the first line current and the second line current such that while the first line current is active, a transition of a magnetic field provided by a change of the second line current is provided such that the transition time of the magnetic field is shorter than the time required for the magnetization of the magnetoresistive memory cell to relax into a changed equilibrium state.

The memory module may be a stackable memory module in which at least some of the integrated circuits are stacked one above the other.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. An integrated circuit having a cell arrangement, the cell arrangement comprising:
   at least one magnetoresistive memory cell;
   a first line providing a first line current;
   a second line providing a second line current; and
   a controller controlling the application of the first line current and the second line current such that while the first line current is active, a transition of a magnetic field provided by a change of the second line current is provided such that a transition time of the magnetic field is shorter than a time required for the magnetization of the magnetoresistive memory cell to relax into a changed equilibrium state.

2. The integrated circuit of claim 1, wherein the first line is a bit line and the first line current is a bit line current.

3. The integrated circuit of claim 1, wherein the bit line current is in the range of about 2 mA to about 80 mA.

4. The integrated circuit of claim 3, wherein the bit line current is in the range of about 3 mA to about 60 mA.

5. The integrated circuit of claim 4, wherein the bit line current is in the range of about 10 mA to about 50 mA.

6. The integrated circuit of claim 1, wherein the first line is a tunnel junction line and the first line current is a tunnel junction line current.

7. The integrated circuit of claim 6, wherein the tunnel junction line current is in the range of about 20 µA to about 5 mA.

8. The integrated circuit of claim 7, wherein the tunnel junction line current is in the range of about 50 µA to about 1 mA.

9. The integrated circuit of claim 1, wherein the transition time of the magnetic field is shorter than about 10 ns.

10. The integrated circuit of claim 1, wherein the second line is a word line and the second line current is a word line current.

11. The integrated circuit of claim 10, wherein the word line current is in the range of about 2 mA to about 80 mA.

12. The integrated circuit of claim 1, wherein the at least one magnetoresistive memory cell comprises a Stoner-Wohlfarth type magnetoresistive memory cell.

13. The integrated circuit of claim 1, wherein the at least one magnetoresistive memory cell comprises a Spin-Torque type magnetoresistive memory cell.

14. A cell arrangement comprising:
   at least one magnetoresistive memory cell;
   a first line providing a first line current;
   a second line providing a second line current; and
   a controller controlling the application of the first line current and the second line current such that while the first line current is active, a transition of a magnetic field provided by a change of the second line current is provided such that a transition time of the magnetic field is shorter than a time required for the magnetization of the magnetoresistive memory cell to relax into a changed equilibrium state.

15. An integrated circuit having a cell arrangement, the cell arrangement comprising:
   at least one magnetoresistive memory cell;
   a first line providing a first line current;
   a second line providing a second line current; and
   a controller controlling the application of the first line current and the second line current such that while the first line current is active, a transition of a magnetic field provided by a change of the second line current is provided,
   wherein the magnetic field has a non-zero angle with regard to the magnetization orientation of the magnetoresistive memory cell, and
   wherein the transition of the magnetic field is sufficiently fast to reduce the switching field of the magnetoresistive memory cell.

16. The integrated circuit of claim 15, wherein the first line is a bit line and the first line current is a bit line current.

17. The integrated circuit of claim 15, wherein the bit line current is in the range of about 2 mA to about 80 mA.

18. The integrated circuit of claim 15, wherein the first line is a tunnel junction line and the first line current is a tunnel junction line current.

19. The integrated circuit of claim 18, wherein the tunnel junction line current is in the range of about 20 µA to about 5 mA.

20. The integrated circuit of claim 15, wherein the time of the transition of the magnetic field is shorter than about 10 ns.

21. The integrated circuit of claim 15, wherein the second line is a word line and the second line current is a word line current.

22. The integrated circuit of claim 15, wherein the at least one magnetoresistive memory cell comprises a Stoner-Wohlfarth type magnetoresistive memory cell.

23. The integrated circuit of claim 15, wherein the at least one magnetoresistive memory cell comprises a Spin-Torque type magnetoresistive memory cell.

24. A method of operating an integrated circuit having a cell arrangement, the method comprising:
   applying a first current to at least one magnetoresistive memory cell; and
   applying, at least partially at the same time, a transition of a magnetic field provided by a change of a second current such that the transition time of the magnetic field is shorter than the time required for the magnetization of the magnetoresistive memory cell to relax into a changed equilibrium state.

25. A memory module, comprising:
   a plurality of integrated circuits, wherein at least one integrated circuit of the plurality of integrated circuits comprises a cell arrangement, the cell arrangement comprising:
   at least one magnetoresistive memory cell;
   a first line providing a first line current;
   a second line providing a second line current; and a controller controlling the application of the first line current and the second line current such that while the first line current is active, a transition of a magnetic field provided by a change of the second line current is provided such that a transition time of the magnetic field is shorter than a time required for the magnetization of the magnetoresistive memory cell to relax into a changed equilibrium state.

* * * * *